United States Patent
Bourgeois et al.

[11] Patent Number: 5,990,688
[45] Date of Patent: Nov. 23, 1999

[54] APPARATUS AND METHOD FOR EVALUATION A CONDITION OF A MAGNETIC CIRCUIT OF AN ELECTRIC MACHINE

[75] Inventors: Jean-Marc Bourgeois, Longueuil; François Lalonde, Varennes, both of Canada

[73] Assignee: Hydro-Quebec, Montreal, Canada

[21] Appl. No.: 09/005,036

[22] Filed: Jan. 9, 1998

[51] Int. Cl.[6] .............................. G01R 31/34; G01R 31/06
[52] U.S. Cl. ........................ 324/545; 324/529; 324/772; 324/240
[58] Field of Search .................................. 324/521, 527, 324/528, 529, 545, 546, 547, 551, 557, 559, 239, 240, 241, 242, 772; 340/648

[56] References Cited

U.S. PATENT DOCUMENTS

| | | | |
|---|---|---|---|
| 4,681,729 | 7/1987 | Pendleton et al. | 376/247 |
| 4,996,486 | 2/1991 | Posedel | 324/545 |
| 5,059,912 | 10/1991 | Trampert | 324/546 |
| 5,341,095 | 8/1994 | Shelton et al. | 324/772 |

*Primary Examiner*—Diep N. Do
*Attorney, Agent, or Firm*—Foley & Lardner

[57] ABSTRACT

The method consists in positioning a probe in front of a pair of teeth provided on the face of the magnetic circuit of an electric machine. The probe has spaced apart magnetic prong portions having respective end faces adapted to match the teeth of the pair with the end faces in registry with the teeth. The prong portions are respectively provided with an excitation winding and a measurement winding. The excitation winding is excited to induce a magnetic flux in a test zone formed of the teeth in front of the probe and a portion of the magnetic circuit extending therebetween. The current flowing in the excitation winding and the voltage across the measurement winding are measured for calculating a resulting power which is indicative of the condition of the test zone. The apparatus is formed of the probe and electronics carrying out the above functions.

20 Claims, 5 Drawing Sheets

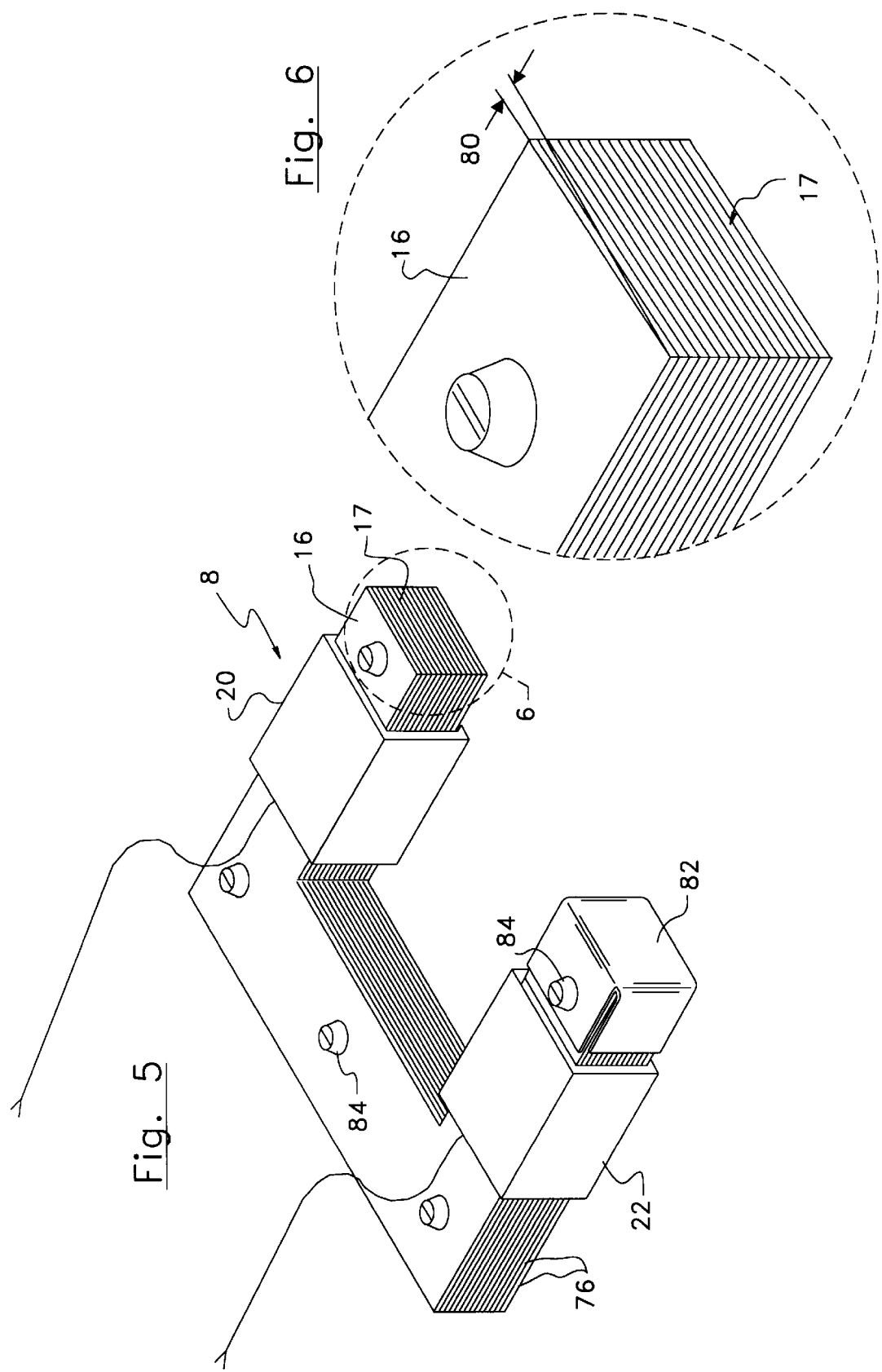

APPARATUS AND METHOD FOR EVALUATION A CONDITION OF A MAGNETIC CIRCUIT OF AN ELECTRIC MACHINE

FIELD OF THE INVENTION

This invention relates in general to testing devices and methods, and more particularly to an apparatus and a method for evaluating a condition of a magnetic circuit of an electric machine. The apparatus and method can be used to detect and spot quickly possible defects on magnetic circuits of stators of large alternators. They are also applicable to motors and transformers.

BACKGROUND

Generally, the magnetic circuit of an electric machine consists of a piling up assembly of metal laminations. To prevent overheating of the laminations caused by the flow of Eddy currents, the laminations are insulated from each other by means of insulating varnish or other materials. Defects to which reference is herein made are caused by short circuits between the metal laminations. In the case of alternators' stators, such defects can be caused for example by a metallic piece (e.g. a bolt) detaching and causing damages to the face of the stator, a breakdown between the winding under voltage (13 kV) and the stator, or the wear of the varnish. These defects must be located.

One method of the prior art consists in a visual inspection. This basic method is still used and allows to locate some apparent defects. This method is subjective as it depends on the skills of the person carrying it out. It cannot be used to detect defects in the notches or between the metal strips of a stator. This method is also difficult to carry out with a rotor in place.

Another method of the prior art consists in a magnetization test. In this method, an intense magnetic flux $\phi t$ ($\approx 80\%$ of the nominal flux) is generated in the stator ring by means of temporary excitation windings mounted on the stator for this purpose. An infrared camera observes the inner face of the stator to detect the hot spots. This method is qualitative and cannot be used to detect defects on only a portion. It requires a powerful external excitation source, and the excitation windings are important. The installation and test times are long, it requires several workers and is impracticable with the rotor in place.

Another method of the prior art consists in an electromagnetic core imperfection detection test (ELCID). In this method, a low magnetic flux $\phi t$ ($\approx 4\%$ of the nominal flux) is induced in the stator ring by means of a temporary excitation winding mounted on the stator for this purpose. A measurement probe explores the inner face of the stator to detect anomalies. In this method, the preparation of the stator is similar to the magnetization test, except that it involves a less powerful source and a more modest temporary excitation winding. This method is quantitative. Nevertheless, it is more or less suitable to detect defects between the metal laminations, it still requires an external excitation source and the mounting of an excitation winding, and several workers. Furthermore, the installation time is long and the test time is in the average.

Both last mentioned methods involve high costs, and may provide inaccurate results.

SUMMARY

One object of the present invention is to provide an apparatus and a method for evaluating a condition of a magnetic circuit of an electric machine, which is simple, accurate and easy to use.

A subsidiary object of the invention is to provide such an apparatus and a method which do not require the mounting and installation of excitation windings onto the electric machine, and is practicable with a rotor and the stator windings in place.

A subsidiary object of the invention is to provide such an apparatus and a method which are cost competitive with respect to the prior art methods, provide quantitative and repeatable results.

The apparatus according to the present invention comprises a probe having a magnetic transverse portion, first and second spaced apart magnetic prong portions projecting from the transverse portion on one side thereof, an excitation winding wound around the first prong portion, and a measurement winding wound around the second prong portion, the prong portions having respective end faces adapted to match a pair of teeth projecting from a face of the magnetic circuit, with the end faces in registry with the teeth. An excitation source is electrically connected to the excitation winding. A current measuring means measures a current flowing in the excitation winding. A voltage measuring means measures a voltage across the measurement winding. A calculating means calculates a resulting power from the current and the voltage measured by the measuring means, the resulting power being indicative of the condition of a test zone formed of the teeth of the pair in front of the probe and a portion of the magnetic circuit extending therebetween.

The method according to the invention comprises the steps of: (a) positioning a probe in front of a pair of the teeth of the magnetic circuit, the probe having a magnetic transverse portion, first and second spaced apart magnetic prong portions projecting from the transverse portion on one side thereof, an excitation winding wound around the first prong portion, and a measurement winding wound around the second prong portion, the prong portions having respective end faces adapted to match the teeth of the pair in front of the probe with the end faces in registry with the teeth of the pair; (b) exciting the excitation winding to induce a magnetic flux in a test zone formed of the teeth of the pair and a portion of the magnetic circuit extending therebetween; (c) measuring a current flowing in the excitation winding; (d) measuring a voltage across the measurement winding; and (e) calculating a resulting power from the current and the voltage, the resulting power being indicative of the condition of the test zone.

The invention is particularly advantageous in that it requires no installation of special excitation circuits around the magnetic circuit of the electric machine to be tested. Immediate interpretation of the results can be achieved with the invention. It takes a relatively short time to inspect the magnetic circuit using the invention, in comparison with the prior art methods. The invention provides simple, accurate and easy to use apparatus and method.

BRIEF DESCRIPTION OF THE DRAWINGS

A detailed description of preferred embodiments of the invention will be given hereinbelow with reference to the following drawings, in which like numbers refer to like elements:

FIG. 5 is a perspective view of the probe of the apparatus according to the invention; and FIG. 6 is an enlarged partial view of one end face of the probe shown in FIG. 5.

DETAILED DESCRIPTION OF PREFERRED EMBODIMENTS

Figure 1:
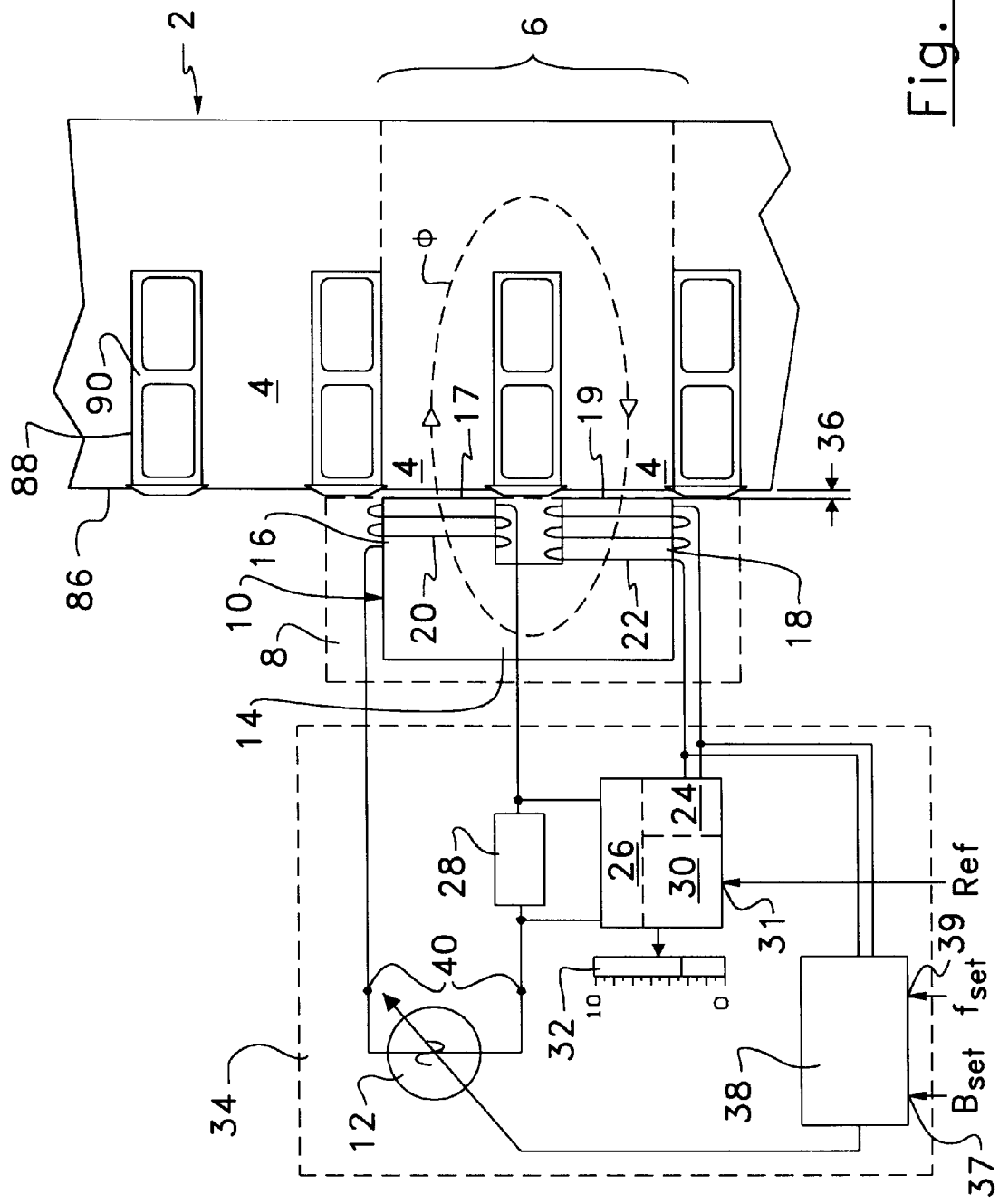
FIG. 1 is a schematic diagram of an apparatus according to the invention, to test the magnetic circuit of a stator.

Referring to FIG. 1, there is shown a schematic diagram of an apparatus according to the invention, to evaluate the condition of the magnetic circuit of a stator 2 (the Figure shows a cross-sectional partial view of the stator 2) having a face 86 provided with a series of spaced apart projecting teeth 4. Such a magnetic circuit is generally formed of an assembly of superimposed laminations of magnetic material, each coated with an electrically insulating material.

The method according to the invention consists in inducing locally a magnetic flux $\phi$ in a portion 6 of the magnetic circuit to be tested, by means of the apparatus according to the invention, which comprises a probe 8 formed of a C-shaped magnetic circuit 10. The same magnetic circuit 10 is also used for detection purposes. In operation, the probe 8 is positioned in front of a pair of teeth 4 of the magnetic circuit of the stator 2. The magnetic circuit 10 of the probe 8 and the test zone 6 of the stator 2, which is magnetically coupled with the probe 8, form a magnetic circuit in test. The magnetic circuit 10 of the probe 8 has a transverse portion 14, and first and second spaced apart prong portions 16, 18 projecting from the transverse portion 14 on one side thereof. The prong portions 16, 18 have end faces 17, 19 adapted to match the pair of teeth 4 in the test zone 6, with the end faces 17, 19 in registry with the teeth 4.

The apparatus has electronics 34 for the generation and the processing of the signals. The electronics 34 include an excitation source 12 connected to an excitation winding 20 wound around the first prong portion 16 of the probe 8, to induce the magnetic flux $\phi$ in the test zone 6. The probe 8 has a measurement winding 22 wound around the second prong portion 18, to measure the level of real flux induced in the magnetic circuit in test. The apparatus is provided with a voltage measurement circuit 24, to measure a voltage V(t) across the measurement winding 22. The voltage V(t) so measured reflects the induced flux since $V(t)=md\phi/dt$, where m is the number of turns of the measurement winding around the second prong portion 18. A current measurement circuit 26 measures the current I(t) required to induce this flux. This can be achieved using a shunt 28 or any other suitable method and device for this purpose. A calculating circuit 30 measures a resulting power from the current and the voltage measured by the measuring circuits 24, 26. The resulting power can be calculated using the instant power formula $P(t)=V(t)\cdot I(t)$. A reading corresponding to the resulting power can be displayed using a meter 32 connected to the calculating circuit 30.

In the absence of defects in the test zone 6, the resulting power corresponds to the normal losses in the whole magnetic circuit in test. The normal losses herein referred to are the normal iron losses. They consist of hysteresis losses $W_h$ and Eddy current losses $W_F$. These losses are generally expressed in Watt/cm$^3$ and sometimes in Watt/Kg. The hysteresis losses are given by $W_h=\eta f B^n$ where $\eta$ is a coefficient associated to the quality of the laminations involved in the process, f is the excitation frequency, and B is the maximal induction raised to the power of n, $1 < n \leq 2$.

The Eddy current losses are given by $W_F=(e/\rho)f^2B^2$ where e is the thickness of the laminations involved in the process, $\rho$ is the resistivity of the materials, f is the excitation frequency, and B is the maximal induction raised to the power of 2. The apparatus measures the total losses $W_t=W_h+W_F$. With the present configuration of the magnetic circuit in test, the total losses can be calculated with the relation $W_t=Kf^{1.5}B^{1.9}$ where K is a coefficient that takes the quality of the laminations (thickness, resistivity, hysteresis factor, etc.) into account. The two exponents can be different on other configurations.

In the presence of defects in the test zone 6, an increase of the value of the resulting power can be observed, thus of the losses. In the presence of defects (e.g. short circuit between the laminations) in the magnetic circuit in test, the measured power increases since these defects give rise to additional Eddy currents. The apparatus thus measures $W_t=W_h+W_F+W'_F$ where $W'_F$ represents the additional losses caused by the currents flowing in the defects (assimilable to Eddy currents).

Thus, the resulting power is indicative of the condition of the test zone 6 formed of the teeth 4 of the pair involved in the process and a portion of the magnetic circuit extending therebetween.

By carrying out the difference between the typical losses without the presence of defects and the losses reported by the meter 32, there is obtained a value linked to the gravity of the possible defects. This operation can be achieved, for example, mentally (the user compares the reading with preestablished records), by calibrating the "O" of the meter 32 prior to the test, or by devising the calculating circuit 30 to automatically take the typical losses into account during the calculations. In such a case, the calculating circuit 30 has an input 31 to receive a signal REF indicative of the typical losses.

The difference between the measured power and the typical power lets appear only the term $W'_F$ linked to the scale of the defect. The issue consists in determining the value of the losses said to be "normal" in order to obtain a reading close to zero when there are no defects. Two ways are possible. A first way consists in determining the normal losses (probe 8 and test zone 6) by calculations. In regard to the electric machine, the various coefficients characteristic of the laminations of the stator in test, the thickness of the laminations, the effective volume in test, the various induction levels in this volume, the parasitic effects such as the expansion coefficient or the leakage flux, must all be known. The margin of error on the final value is likely to be important. In regard to the probe 8, it is a constant that can be determined in laboratory. A second way consists in statistically determining the "normal" losses. Ideally, measurements will be achieved at the starting up of the electric machine. There is thus obtained a representative value (average of the distribution with a low standard deviation) of the losses for this machine. It is the zero, the absolute reference of its background history. Measurements can also be achieved on a machine having a given lifetime but the state of which is reputed to be good. In this case, the distribution could be slightly more spread out with a higher average if there has been an aging. This relative zero can nevertheless be used as a reference for the follow-up and allows to detect the apparition of defects. On a poor condition machine, where the zero has never been determined, the reference will be established by achieving measurements in a zone considered as acceptable. If no reliable reference can be established, there remains the solution of globally analysing, by statistical methods, the results of a large number of measurements on the machine in order to bring out the defects despite the possibly important standard deviation, the bimodal distribution, etc.

To become independent from the residual gap 36 between the end faces 17, 19 of the prong portions 16, 18 and the teeth 4 of the magnetic circuit, the excitation source 12 is preferably adjusted to obtain a flux $\phi$ of constant amplitude, thus a V(t) across the measurement winding 22 of constant amplitude. This adjustment can be manual or automated.

Since the losses are directly linked to the level of induction B, it is important to know the latter. For this purpose, it is either possible to normalize (by calculation) the measured losses at some level towards a reference level of induction, or to operate at a constant level of induction (to render the measurements immediately comparable).

In practice, the induction changes can result from two principal sources.

The first principal source is the variations of the gap 36 between the end faces 17, 19 of the prong portions 16, 18 and the teeth 4 in the test zone 6. Without correction, these variations are likely to cause a change in the level of induction each time the probe 8 is applied on the magnetic circuit of the electric machine. The second principal source is the reluctance of the magnetic circuit of the electric machine in test. From machine to machine, the magnetic circuit does not necessarily have the same depth, the same gauge between the teeth 4, and is not formed of materials having identical magnetic properties. Without correction, these variations cause a change in the level of induction from one machine to the other.

In the embodiment of the apparatus shown in FIG. 1, there is provided a control circuit 38 to control the voltage of the AC signal produced by the excitation source 12 as a function of the voltage V(t) across the measurement winding 22. The purpose of the control circuit 38 is to automatically control the induction of the probe 8 based on the general equation B=V/mSf. Thus, by measuring the instant voltage V across the measurement winding 22, the induction B can be known at the level of this branch (the prong portion 18) of the magnetic circuit in test since the number of turns m of the measurement winding 22, the section S of the magnetic circuit in test (the section of the second prong portion 18) and the excitation frequency f are known. The voltage of the excitation source 12 will be controlled consequently to meet an induction setting $B_{set}$ for example by way of a comparison. The control circuit 38 may be provided with an input 37 to receive the induction setting signal $B_{set}$ and, in the case where the excitation source has a controllable frequency, an input 39 to receive a frequency setting signal $f_{set}$.

Figure 3:
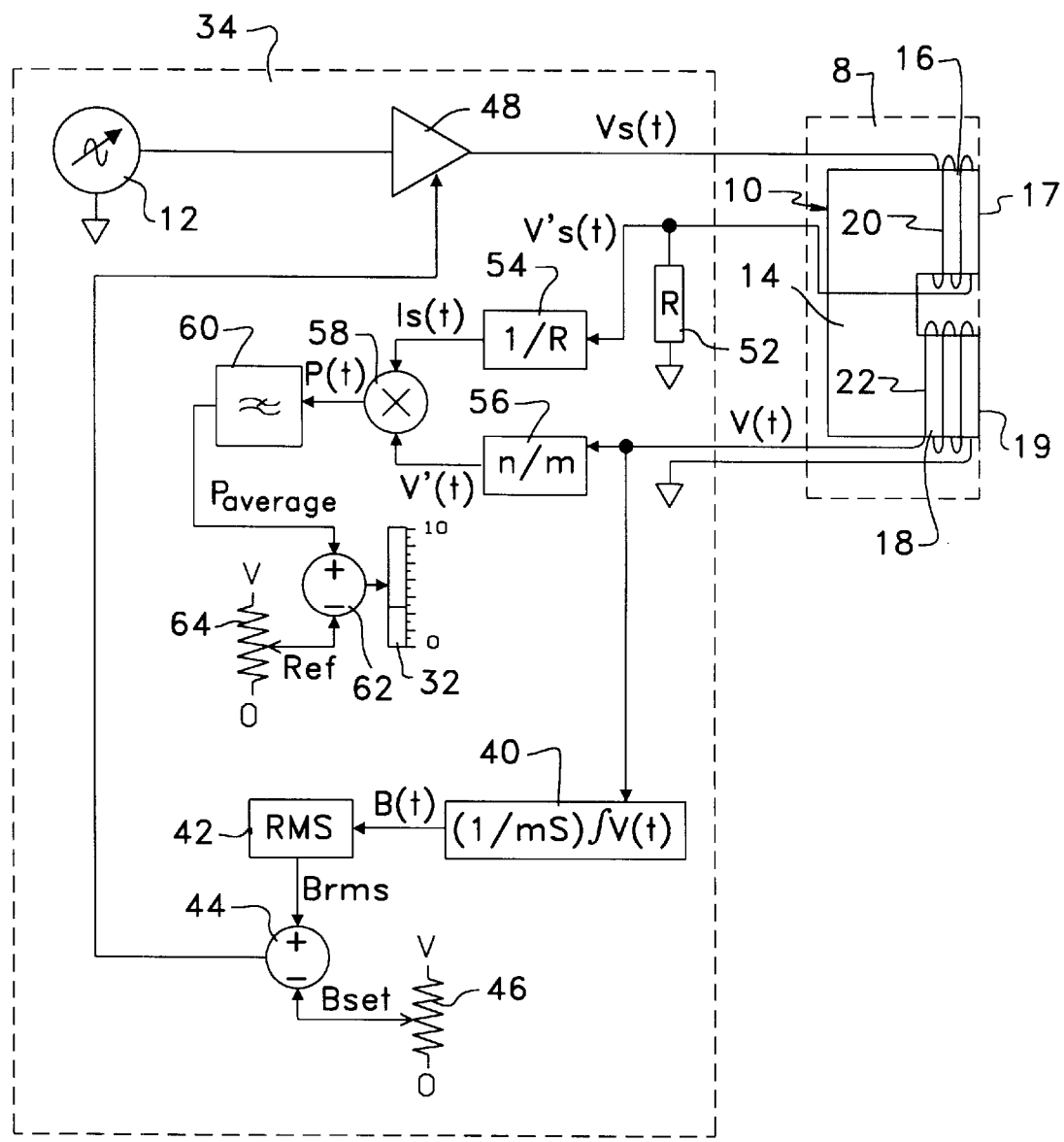
FIG. 3 is a schematic diagram of an analog excitation and measurement circuit for the apparatus according to the invention.

Referring to FIG. 3, there is shown a possible analog version of the electronics 34 of the apparatus. In this version, the excitation source 12 produces an AC signal having a given voltage and an adjustable frequency. The control circuit is embodied by an integrator 40, a RMS (root-means-square) circuit 42, a differential circuit 44, a potentiometer 46 and a gain controllable amplifier 48.

The integrator 40 is connected to the measurement winding 22 and performs the function $(1/Sm)\int V(t)$ where S is the section of the magnetic circuit 10 under the measurement winding 22, m is the number of turns of the measurement winding 22 around the prong portion 18 and V(t) is the voltage across the measurement winding 22. This function provides the density of magnetic flux B(t) in the magnetic circuit in test, in the form of a voltage. This voltage is transmitted to the RMS circuit 42 that provides a rms value of the flux density $B_{rms}$, in the form of a voltage. This voltage is transmitted to the differential circuit 44 that produces a control signal proportional to the difference between the voltage representing $B_{rms}$ and a voltage representing the desired induction $B_{set}$ in the circuit in test. The voltage representing the desired induction $B_{set}$ can be produced using a simple potentiometer 46 that permits an adjustment. The control signal is transmitted to a gain controlled amplifier 48 connected between the excitation source 12 and the excitation winding 20.

The excitation winding 20 is shunted by means of a resistor 52 having a low resistance R. The voltage $V'_s(t)$ across the resistor 52 is applied to a 1/R gain circuit 54, to produce a voltage signal representing the instant current I(t) flowing in the excitation winding 20. The voltage V(t) across the measurement winding 22 is applied to a n/m gain circuit 56 to produce a voltage signal V'(t) representing the instant voltage across the inductive part of the excitation winding 20, n, m being the number of turns of the excitation and measurement windings 20, 22, respectively. Both voltage signals produced by the gain circuits 54, 56 are transmitted to a multiplier 58 that produces a voltage signal representing the instant power P(t) in the magnetic circuit in test. The voltage signal produced by the multiplier 58 is passed into a low-pass filter 60 to obtain a voltage signal representing the average power $P_{average}$, indicative of the losses in the magnetic circuit in test. This filtered voltage signal is transmitted to a differential circuit 62 that subtracts a voltage representing the typical losses of the magnetic circuit in test (i.e. no defects), and produces a signal indicative of power losses caused by possible defects in the magnetic circuit in test (i.e. in the test zone 6 as shown in FIG. 1). The typical losses can be adjusted using a potentiometer 64.

Figure 4:
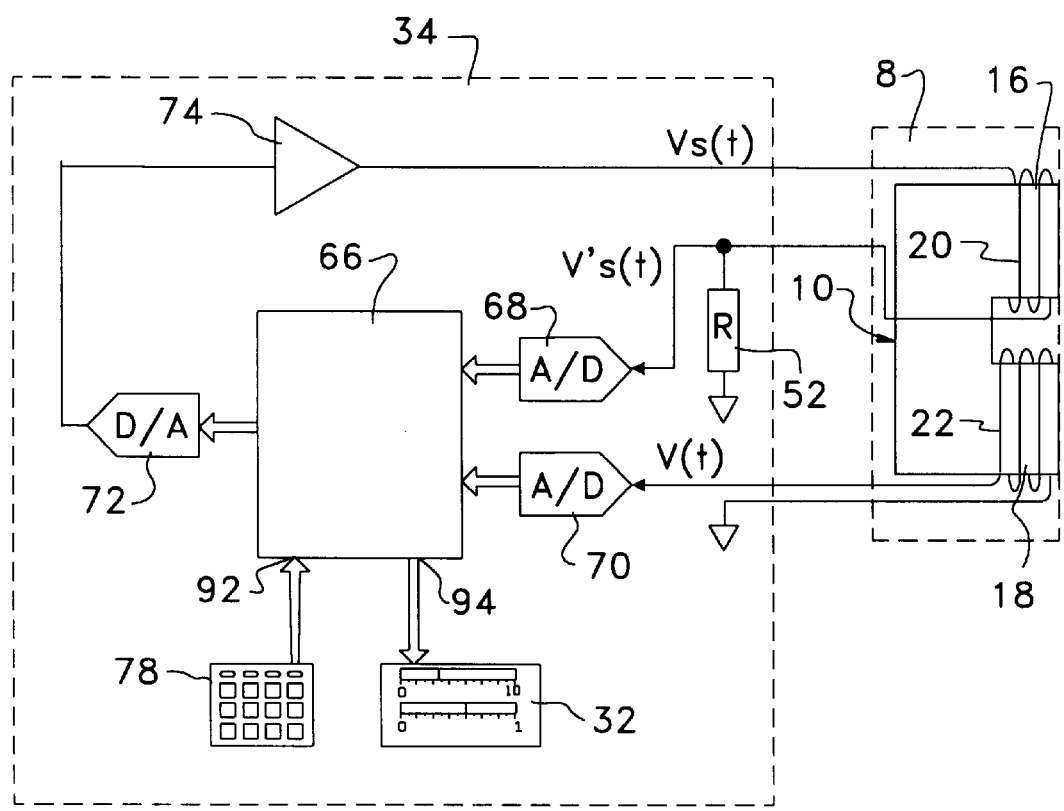
FIG. 4 is a schematic diagram of a digital excitation and measurement circuit for the apparatus according to the invention.

Referring to FIG. 4, there is shown a possible digital version of the electronics 34 of the apparatus. In this version, all the functions performed by the measurement, calculating and control circuits and the excitation source, are conveniently provided by a circuit arrangement based on a microcontroller 66. The microcontroller 66 is provided with analog-to-digital converters 68, 70 to convert the voltages $V'_s(t)$ and V(t) into digital signals readable by the microcontroller 66. The excitation source is provided by a digital-to-analog converter 72 connected to the microcontroller 66, and an amplifier 74. The microcontroller 66 has an input 92 connectable to a keypad 78 that can be used to set the desired induction level for the probe 8 and the operating frequency of the excitation source, in addition to various other operating parameters of the apparatus like the basic losses reference, the probe type (number of turns of the windings 20, 22), etc. The microcontroller 66 has an output 94 connectable to a meter 32 used to provide a reading of the losses calculated by the microcontroller 66, thus a display of the gravity of the defect, as well as other data at the request of the user.

The microcontroller 66 is thus programmed to achieve all the necessary calculations, including the control of the flux density.

With the calculation power of a microcontroller, the performance of the apparatus can be improved in several ways, e.g. the automatic learning of the basic loss values, the storage and selection of these values in relation with identified electric machines, the display of various parameters like the induction level, the measured current, statistics over a series of measurements, the storage of the data for later analysis.

By using V(t) across the measurement winding 22 instead of the voltage of the AC signal produced by the excitation source 12, the copper losses in the excitation winding 20 are eliminated from the loss calculations. This thus improves the sensitivity of the apparatus. In a same fashion, high quality magnetic materials and a proper geometry should be chosen in the construction of the probe 8 in order to minimize the losses in the probe 8 itself.

The calculation of the losses takes into account the losses in the test zone 6 and also in the probe 8 itself since it is an intrinsic part of the whole magnetic circuit in test. The apparatus will be all the more sensitive that the fixed losses will be minimized. On the side of the stator, there are always basic losses that are evaluated as hereinabove described, to eliminate them from the measurement. On the side of the probe 8, there are losses in the magnetic circuit 10 (iron losses) and losses in the windings 20, 22 (copper losses).

Referring to FIG. 5, there is shown an embodiment of the probe 8. The probe is made of high quality, electrically insulated and piled-up laminations 76, as for the stator. The quality of the laminations 76 is chosen to minimize the (iron) losses in the probe 8 and to obtain a magnetic path having the lowest possible reluctance.

This is achieved by using thin laminations 76 of high permittivity, of low hysteresis factor, of high resistivity, etc. It is also a matter of proper geometry, i.e. of short magnetic circuit 10, of minimal volume, of optimal angle on the end faces 17, 19 in magnetic contact with the stator to minimize the gap 36 (as shown in FIG. 1), of concentrated windings 20, 22 to minimize the leakage flux, etc.

Figure 2:
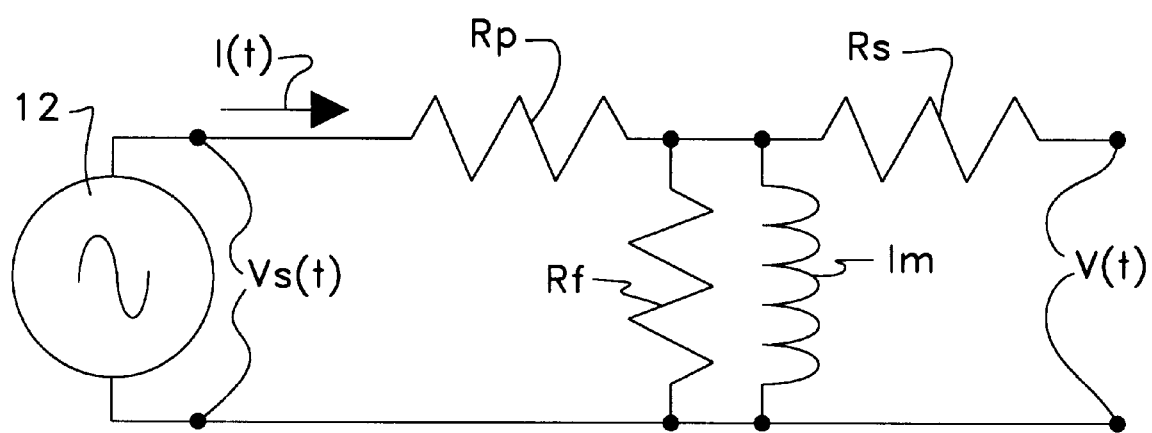
FIG. 2 is a simplified equivalent electrical circuit of the apparatus with the magnetic circuit as shown in FIG. 1.

Referring to FIG. 2, there is shown a simplified equivalent circuit of the apparatus.

To minimize the copper losses, conductors of very low resistance $R_p$ are preferably used. The calculation of the losses can be carried out with the relation $W_t=V_s(t)\cdot I(t)$ where $V_s(t)$ is the voltage of the AC signal produced by the excitation source 12, and $I(t)$ is the current flowing in the excitation winding 20.

In such a case, the iron losses represented by $R_f$, and the copper losses, represented by $R_p$, of the probe 8 are taken into account. There are no copper losses in the secondary winding 22 if the circuit is open. To calculate only the iron losses, it would be necessary to not use the voltage $V_s(t)$ of the source 12 but the voltage across $R_f$. This point is not physically accessible. However, this voltage corresponds exactly (close to the ratio of turn) to the output voltage V(t) if the winding 22 of the secondary is open. Thus, $W_t=V(t)\cdot I(t)$ corresponds solely to the iron losses in an ideal circuit as the one shown in FIG. 2.

Referring to FIG. 1, the frequency setting via the control circuit 38 allows to control the frequency f of the excitation source 12. This feature is advantageous for at least two reasons. In the present electric machines, the range of use spreads from 50 Hz to some kilohertz. As the frequency increases, the Eddy current losses ($f^2$) dominate over the hysteresis losses (proportional to f). But, the searched defects are seen as Eddy current losses. The sensitivity of the apparatus is thus increased. The construction of the probe 8 is easier at high frequency. The excitation winding 20 has less turns, and the magnetic circuit 10 requires less metal.

The dimensions of the probe 8 are defined by certain considerations. Preferably, the length of the magnetic path in the probe 8 is minimized. The same applies to the volume of metal of the probe 8. The probe 8 should match with the teeth 4 of the stator in test. The center-to-center distance between the prong portions 16, 18 of the probe 8 is preferably the same as the center-to-center distance between the teeth 4 of the stator. It is also preferable that each prong portion 16, 18 of the probe 8 be slightly narrower than the width of a tooth 4.

This facilitate the alignment and provides a better magnetic coupling. The teeth 4 are normally formed by groups of laminations, the groups being separated by ventilation channels. The height of a tooth is in the range of 4 to 5 cm, whereas the height of a ventilation channel is in the range of 5 to 6 mm. The teeth 4 are also separated by vertical notches 88 receiving the power windings 90. In regard to the thickness of the probe 8, there are two limits. The probe 8 could be of the same thickness as a tooth 4. In this case, it would be only possible to locate the defective tooth 4. The probe 8 could be very thin (a few laminations). In this case, the position of the defect could be located within the tooth 4 itself. However, this accuracy considerably increases the inspection time and makes the alignment of the probe 8 harder. Preferably, for standard stator configurations, the probe 8 has a thickness that represents the third of the height of a tooth 4. Portability and ease of use are also other factors that can be taken into account.

The gap 36 should be minimized and maintained the most constant as possible. If the gap 36 is too important, there is no longer magnetic coupling with the stator. Thus, defects cannot be located. However, this situation is easily detectable by the apparatus since the current of the excitation source 12 becomes abnormally high. In the normal range of operation, in the order of the millimeter, the coupling is adequate. Normally, the part of the face 86 of the stator 2 involved in the process is not flat; it is a tiny portion ($\approx$20 cm) of a circle ($\approx$10 m of diameter). To improve the magnetic coupling and reduce the gap 36 between the end faces 17, 19 of the prong portions 16, 18 and the teeth 4 in the test zone 6, the end faces 17, 19 are preferably machined to match the curvature of the stator 2.

Referring to FIG. 6, since the diameter of the stator 2 is large in comparison with the spacing of the prong portions 16, 18, it is not necessary to machine the end faces 17, 19 in arcs of a circle; a simple angle 80 is sufficient.

Referring to FIG. 5, the residual gap 36 thus principally results from the roughness of the teeth surfaces, the presence of surface paint and the quality of the alignment of the probe 8. A simple manner to minimize the variations of the gap 36 is to impose a known gap. This can be achieved by providing the end faces 17, 19 of the probe 8 with spacers 82 (only the spacer 82 for the end face 19 is shown in the Figure, for clarity reasons) of known thickness, e.g. 0.5 mm layers of Teflon. Thus, the effect of the gap 36 is controlled and the sliding of the probe 8 is even facilitated. The spacers 82 can be attached to the probe 8 in any suitable manner. For example, each spacer 82 can be formed of a single Teflon sheet folded on each prong portion 16, 18 of the probe 8. The bolts 84 used to hold the laminations 76 together can be used to also hold the Teflon sheets. The assembly of laminations 76 of the probe 8 could also be wrapped in a plastic coating to hold them together, protect them and provide at the same time the spacers 82.

It should be noted that the previous explanations and equations are valid insofar as the magnetic circuit is not saturated. The fact of operating at a fixed and controlled induction overcomes this problem.

While embodiments of this invention have been illustrated in the accompanying drawings and described above, it will be evident to those skilled in the art that changes and modifications may be made therein without departing from the essence of this invention. For example, the probe 8 may be provided with additional prong portions (not shown) to cover several teeth 4 at a time. The shape of the probe 8 can be changed, insofar as it suits the above-described functions. The spacers 82 may be used to provide the angle 80 instead of the end faces 17, 19. The probe 8 can be applied to two adjacent teeth 4 or not (i.e. with other teeth 4 in between). The probe 8 can be formed for example of metallic powder. All such modifications or variations are believed to be within the scope of the invention as defined by the claims appended hereto.

What is claimed is:

1. An apparatus for evaluating a condition of a magnetic circuit of an electric machine, the magnetic circuit having a face provided with a series of spaced apart projecting teeth, the apparatus comprising:

a probe having a magnetic transverse portion, first and second spaced apart magnetic prong portions projecting from the transverse portion on one side thereof, an excitation winding wound around the first prong portion, and a measurement winding wound around the second prong portion, the prong portions having respective end faces adapted to match a pair of said teeth with the end faces in registry with the teeth of said pair;

an excitation source electrically connected to the excitation winding;

current measuring means for measuring a current flowing in the excitation winding;

voltage measuring means for measuring a voltage across the measurement winding; and calculating means for calculating a resulting power from the current and the voltage measured by the measuring means, the resulting power being indicative of the condition of a test zone formed of the teeth of said pair and a portion of the magnetic circuit extending therebetween.

2. The apparatus of claim 1, wherein the excitation source has an output to produce an AC signal having a voltage, the apparatus further comprising a control means for controlling the voltage of the AC signal as a function of the voltage across the measurement winding.

3. The apparatus of claim 2, wherein the control means comprise:

comparing means for comparing an induction B in the probe with an induction setting, the induction B being expressed as B=V/mSf where V is the voltage across the measurement winding, m is a number of turns of the measurement winding around the second prong portion, S is a section of the second prong portion, and f is a frequency of the AC signal; and adjusting means responsive to the comparing means, for adjusting the voltage of the AC signal so that the induction B corresponds to the induction setting.

4. The apparatus of claim 1, wherein the calculating means comprise means for subtracting a reference power loss value from the resulting power.

5. The apparatus of claim 1, further comprising a meter connected to the calculating means to display a reading representative of the resulting power.

6. The apparatus of claim 1, wherein the portions of the probe comprise a number of superimposed laminations electrically insulated from each other.

7. The apparatus of claim 1, wherein the end faces of the prong portions have a center-to-center distance corresponding substantially to a center-to-center distance between the teeth of said pair.

8. The apparatus of claim 1, wherein the teeth have a predetermined width, and the end faces of the prong portions have a width smaller than the width of the teeth.

9. The apparatus of claim 1, wherein the end faces of the prong portions are provided with electrically insulating spacers adapted to abut against the teeth of said pair to fix a gap thickness between the probe and the teeth of said pair when the probe is in operating position.

10. The apparatus of claim 1, wherein the portions of the probe generally have together a C-shaped configuration.

11. The apparatus of claim 1, wherein the end faces of the prong portions are beveled with respect to main axes of the prong portions.

12. The apparatus of claim 1, wherein the measuring and calculating means are provided by a circuit comprising:

a first analog to digital converter having an input connected to the excitation winding, and an output;

a second analog to digital converter having an input connected to the measurement winding, and an output; and a microcontroller having first and second inputs connected respectively to the outputs of the analog to digital converters, and an output to produce a signal representative of the resulting power.

13. The apparatus of claim 2, wherein the measuring and calculating means, the excitation source and the control means are provided by a circuit comprising:

a first analog to digital converter having an input connected to the excitation winding, and an output;

a second analog to digital converter having an input connected to the measurement winding, and an output;

a microcontroller having first and second inputs connected respectively to the outputs of the analog to digital converters, a third input to receive setting signals, a first output to produce a signal representative of the resulting power, and a second output to produce a digital signal representative of the AC signal; and a digital to analog converter and amplifier circuit arrangement, having an input connected to the second output of the microcontroller, and an output to produce the AC signal.

14. The apparatus of claim 13, further comprising:

a meter connected to the first output of the microcontroller to display a reading representative of the resulting power; and a keypad connected to the third input of the microcontroller, to generate the setting signals.

15. A method for evaluating a condition of a magnetic circuit of an electric machine, the magnetic circuit having a face provided with a series of spaced apart projecting teeth, the method comprising the steps of:

positioning a probe in front of a pair of said teeth, the probe having a magnetic transverse portion, first and second spaced apart magnetic prong portions projecting from the transverse portion on one side thereof, an excitation winding wound around the first prong portion, and a measurement winding wound around the second prong portion, the prong portions having respective end faces adapted to match the teeth of said pair with the end faces in registry with the teeth of said pair;

exciting the excitation winding to induce a magnetic flux in a test zone formed of the teeth of said pair and a portion of the magnetic circuit extending therebetween;

measuring a current flowing in the excitation winding;

measuring a voltage across the measurement winding; and calculating a resulting power from the current and the voltage, the resulting power being indicative of the condition of the test zone.

16. The method of claim 15, further comprising the step of:

comparing the resulting power with a reference power value to determine a defect condition in the test zone.

17. The method of claim 16, wherein the reference power value is determined by calculating a typical power to be expected as a function of physical characteristics of the magnetic circuit and the probe.

18. The method of claim 16, wherein the reference power value is determined by performing the method before a first use of the magnetic circuit.

19. The method of claim 15, wherein the steps are repeated for all the teeth of the magnetic circuit to locate possible defective portions thereof.

20. The method of claim 19, wherein the excitation source is adjusted to induce a magnetic flux having a constant amplitude in each test zone.

* * * * *